United States Patent [19]

Hoffman et al.

[11] Patent Number: 5,722,442
[45] Date of Patent: Mar. 3, 1998

[54] ON-SITE GENERATION OF ULTRA-HIGH-PURITY BUFFERED-HF FOR SEMICONDUCTOR PROCESSING

[75] Inventors: Joe G. Hoffman, Cardiff; R. Scot Clark, Fallbrook, both of Calif.

[73] Assignee: Startec Ventures, Inc., Fallbrook, Calif.

[21] Appl. No.: 674,130

[22] Filed: Jul. 1, 1996

Related U.S. Application Data

[63] Continuation-in-part of Ser. No. 610,261, Mar. 4, 1996, and a continuation of Ser. No. 179,001, Jan. 7, 1994, Pat. No. 5,496,778.

[51] Int. Cl.⁶ .................................................. B08B 3/10
[52] U.S. Cl. .................. 134/102.1; 134/111; 134/105; 134/902; 210/900
[58] Field of Search .................................. 134/105, 107, 134/108, 109, 111, 902, 95.3, 95.2, 98.1, 104.4, 110, 102.2, 102.1; 210/900, 638, 641, 195.2, 243

[56] References Cited

U.S. PATENT DOCUMENTS

| | | |
|---|---|---|
| 4,756,899 | 7/1988 | Jenczewski et al. . |
| 4,828,660 | 5/1989 | Clark et al. . |
| 4,917,123 | 4/1990 | McConnell et al. ............... 123/902 |
| 4,929,435 | 5/1990 | Boghean et al. . |
| 4,952,386 | 8/1990 | Davison et al. . |
| 4,980,032 | 12/1990 | Dobson et al. . |
| 5,024,766 | 6/1991 | Mahmud ............................ 210/900 |
| 5,164,049 | 11/1992 | Clark et al. . |
| 5,190,065 | 3/1993 | Kivac et al. ....................... 134/111 |
| 5,250,183 | 10/1993 | Sawada et al. .................... 210/900 |
| 5,288,333 | 2/1994 | Tanaka et al. . |
| 5,346,557 | 9/1994 | Ito et al. . |
| 5,362,469 | 11/1994 | Seseke-Koyro et al. . |
| 5,377,705 | 1/1995 | Smith, Jr. et al. ................ 134/902 |
| 5,496,778 | 3/1996 | Hoffman et al. . |
| 5,500,098 | 3/1996 | Brown et al. . |
| 5,542,441 | 8/1996 | Mohindra et al. ................ 210/900 |
| 5,571,419 | 11/1996 | Obata et al. ...................... 210/900 |

FOREIGN PATENT DOCUMENTS

| | | | |
|---|---|---|---|
| 2920212 | 11/1980 | Germany | 210/900 |
| 149799 | 7/1981 | Germany | 210/900 |
| 63-31592 | 2/1988 | Japan | 210/900 |
| 63-44988 | 3/1988 | Japan | 210/900 |
| 63-59387 | 3/1988 | Japan | 210/900 |
| 63-100998 | 6/1988 | Japan | 210/900 |
| 63-152603 | 10/1988 | Japan . | |
| 63-283027 | 11/1988 | Japan . | |
| 64-34407 | 2/1989 | Japan . | |
| 1-100289 | 4/1989 | Japan . | |
| 1-107811 | 4/1989 | Japan . | |
| 1-231988 | 9/1989 | Japan | 210/900 |
| 4-284887 | 10/1992 | Japan | 210/900 |
| 62213127 | 9/1997 | Japan . | |
| 2063094 | 6/1981 | United Kingdom | 210/900 |

*Primary Examiner*—Frankie L. Stinson
*Attorney, Agent, or Firm*—Burns, Doane, Swecker & Mathis, L.L.P.

[57] ABSTRACT

A process for preparing ultra-high-purity buffered hydrofluoric acid on-site at a semiconductor manufacturing facility (front end). Anhydrous ammonia is purified by scrubbing in a high-pH liquor, and then combined with high-purity aqueous HF which has been purified by a similar process. The generation is monitored by a density measurement to produce an acid whose pH and buffering are accurately controlled.

5 Claims, 6 Drawing Sheets

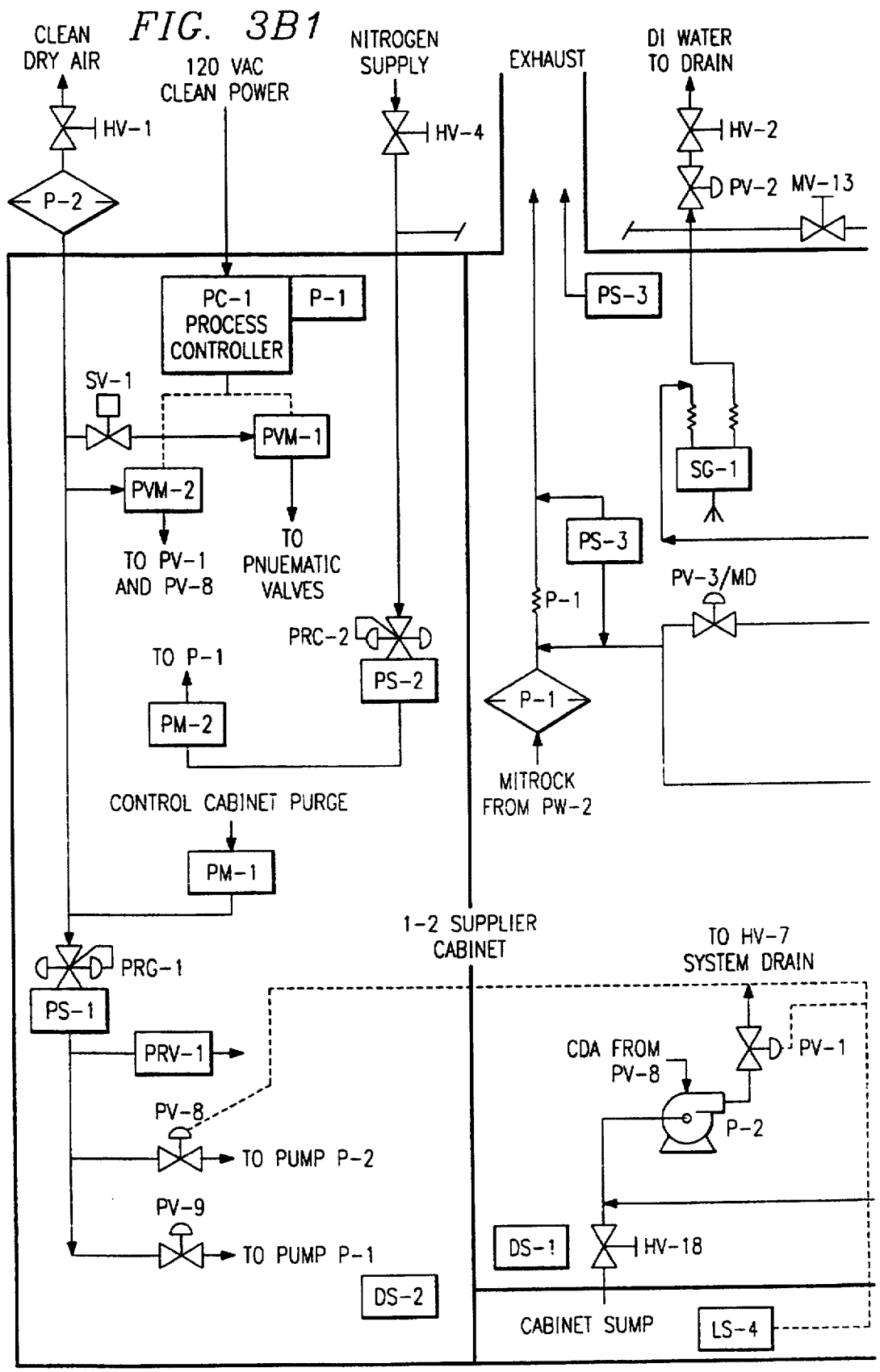
FIG. 3B1

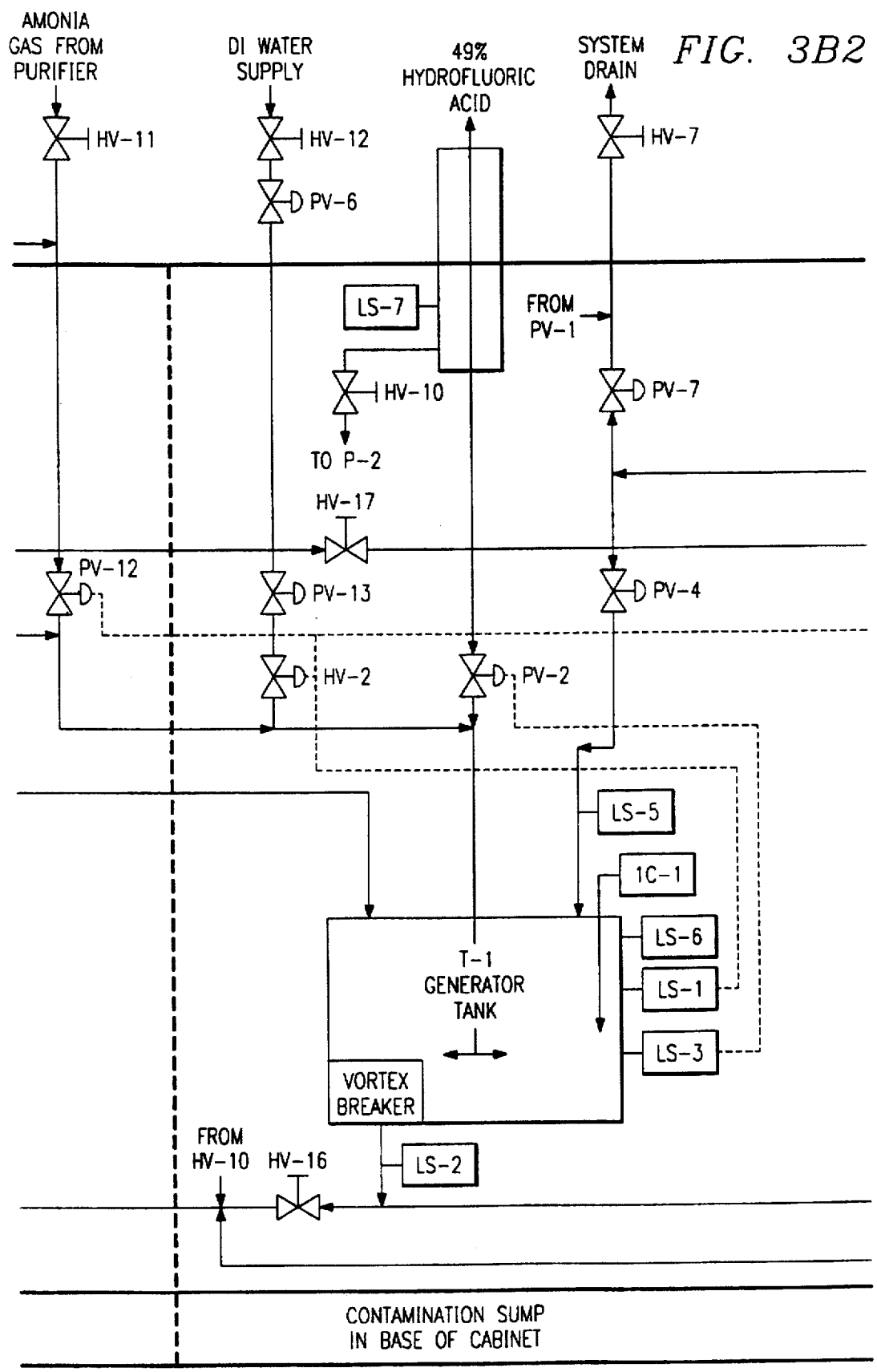
FIG. 3B2

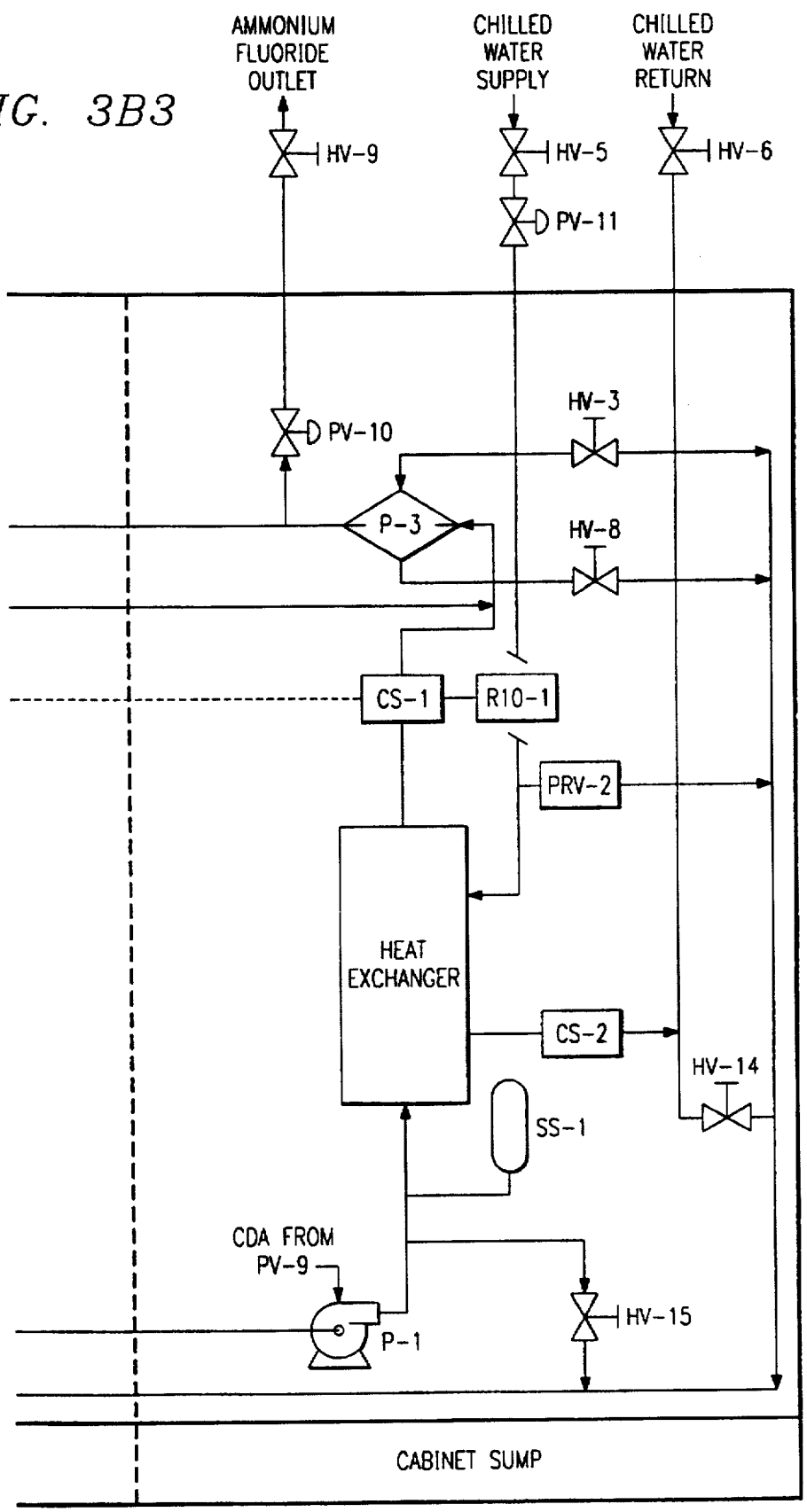
FIG. 3B3

ON-SITE GENERATION OF ULTRA-HIGH-PURITY BUFFERED-HF FOR SEMICONDUCTOR PROCESSING

This application is a continuation-in-part of application Ser. No. 610,261, filed Mar. 4, 1996, still pending and a continuation of application Ser. No. 179,001, filed Jan. 7, 1994, now U.S. Pat. No. 5,496,778. Provisional application No. 60/018,104, filed Jul. 7, 1995.

BACKGROUND AND SUMMARY OF THE INVENTION

The present invention relates to systems and methods for supplying ultra-high-purity buffered-HF (buffered hydrofluoric acid) and/or ammonium fluoride ($NH_4F$) for semiconductor manufacture.

BACKGROUND

Contamination in IC Manufacturing

Contamination is generally an overwhelmingly important concern in integrated circuit manufacturing. A large fraction of the steps in modern integrated circuit manufacturing are cleanup steps of one kind or another; such cleanup steps may need to remove organic contaminants, metallic contaminants, photoresist (or inorganic residues thereof), byproducts of etching, native oxides, etc.

As of 1995 the cost of a new front end (integrated circuit wafer fabrication facility) is typically more than a billion dollars ($1,000,000,000), and a large fraction of this cost is directed to measures for particulate control, cleanup, and contamination control.

One important source of contamination is impurities in the process chemicals. Since the cleanups are so frequent and so critical, contamination due to cleanup chemistry is very undesirable.

The extreme purity levels required by semiconductor manufacturing are rare or unique among industrial processes. At such extreme purity levels, handling of chemicals is inherently undesirable (though of course it cannot be entirely avoided). Exposure of the ultrapure chemical to air (particularly in an environment where workers are also present) must be minimized. Such exposure risks introduction of particulates, and resulting contamination. Shipment of ultrapure chemicals in closed containers is still not ideal, since there is inherently a higher risk of contaminants at the manufacturer or at the user's site. Moreover, undetected contamination may damage an expensively large quantity of wafers.

Since many corrosive and/or toxic chemicals are commonly used in semiconductor processing, the reagent supply locations are commonly separated from the locations where front-end workers are present. Construction and maintenance of piping for ultra-high-purity gasses and liquids are well-understood in the semiconductor industry, so most gasses and liquids can be transported to wafer fabrication stations from anywhere in the same building (or even in the same site).

Ammonia Purification

The present inventors have developed a method for preparing ultra-high-purity ammonia, in an on-site system located at the semiconductor wafer production site, by: drawing ammonia vapor from a liquid ammonia reservoir, passing the ammonia vapor through a microfiltration filter, and scrubbing the filtered vapor with high-pH purified water (preferably deionized water which has been allowed to equilibrate with the ammonia stream). This discovery permitted conversion of commercial grade ammonia to ammonia of sufficiently high purity for high-precision manufacturing without the need for conventional column distillation. The drawing of the ammonia vapor from the supply reservoir serves by itself as a single-stage distillation, eliminating nonvolatile and high-boiling impurities, such as alkali and alkaline earth metal oxides, carbonates and hydrides, transition metal halides and hydrides, and high-boiling hydrocarbons and halocarbons. The reactive volatile impurities that could be found in commercial grade ammonia, such as certain transition metal halides, Group III metal hydrides and halides, certain Group IV hydrides and halides, and halogens, previously thought to require distillation for removal, were discovered to be capable of removal by scrubbing to a degree which is adequate for high-precision operations. This is a very surprising discovery, since scrubber technology is traditionally used for the removal of macro-scale, rather than micro-scale, impurities.

Wet Versus Dry Processing

One of the long-running technological shifts in semiconductor processing has been the changes (and attempted changes) between dry and wet processing. In dry processing, only gaseous or plasma-phase reactants come in contact with the wafer. In wet processing, a variety of liquid reagents are used for purposes such as etching silicon dioxide or removing native oxide layers, removing organic materials or trace organic contaminants, removing metals or trace organic contaminants, etching silicon nitride, etching silicon.

Plasma etching has many attractive capabilities, but it is not adequate for cleanup. There is simply no available chemistry to remove some of the most undesirable impurities, such as gold. Thus wet cleanup processes are essential to modern semiconductor processing, and are likely to remain so for the foreseeable future.

Plasma etching is performed with photoresist in place, and is not directly followed by high-temperature steps. Instead the resist is stripped, and a cleanup is then necessary.

The materials which the cleanup must remove may include: photoresist residues (organic polymers); sodium; Alkaline earths (e.g. calcium or magnesium); and heavy metals (e.g. gold). Many of these do not form volatile halides, so plasma etching cannot carry them away. Cleanups using wet chemistries are required.

The result of this is that purity of process chemicals at plasma etching is not as critical, since these steps are always followed by cleanup steps before high-temperature steps occur, and the cleanup steps can remove dangerous contaminants from the surface before high-temperature steps drive in these contaminants. However, purity of the liquid chemicals is much more critical, because the impingement rate at the semiconductor surface is typically a million times higher than in plasma etching, and because the liquid cleanup steps are directly followed by high-temperature steps.

However, wet processing has one major drawback, namely ionic contamination. Integrated circuit structures use only a few dopant species (boron, arsenic, phosphorus, and sometimes antimony) to form the required p-type and n-type doped regions. However, many other species are electrically active dopants, and are highly undesirable contaminants. Many of these contaminants can have deleterious effects, such as increased junction leakage, at concentrations well below $10^{13} cm^{-3}$. Moreover, some of the less desirable contaminants segregate into silicon, i.e. where silicon is in contact with an aqueous solution the equilibrium concentration of the contaminants will be higher in the silicon than in the solution. Moreover, some of the less desirable contaminants have very high diffusion coefficients, so that introduction of such dopants into any part of the silicon wafer will tend to allow these contaminants to diffuse throughout, including junction locations where these contaminants will cause leakage.

Thus all liquid solutions which will be used on a semiconductor wafer should preferably have extremely low levels of all metal ions. Preferably the concentration of all metals combined should be less than 300 ppt (parts per trillion), and less than 10 ppt for any one metal, and less would be better. Moreover, contamination by both anions and cations must also be controlled. (Some anions may have adverse effects, e.g. complexed metal ions may reduce to mobile metal atoms or ions in the silicon lattice).

Front end facilities normally include on-site purification systems for preparation of high-purity water (referred to as "DI" water, i.e. deionized water). However, it is more difficult to obtain process chemicals in the purities needed.

Innovative Systems and Methods for
Semiconductor Manufacturing with On-Site
Generation of Buffered-HF and/or $NH_4F$ The present application discloses systems and methods for preparation of ultrapure chemicals on-site at a semiconductor manufacturing facility, so that they can be piped directly to the points of use. The disclosed systems are very compact units which can be located in the same building as a front end (or in an adjacent building), so that handling is avoided.

It has now been discovered that methods and systems which are similar to those used for preparation of ultrapure aqueous ammonia can be used to prepare ultra-high-purity hydrofluoric acid.

Anhydrous HF is typically manufactured by the addition of sulfuric acid to fluorspar, $CaF_2$. Unfortunately, many fluorspars contain arsenic, which leads to contamination of the resulting HF. Thus arsenic contamination is a dominant problem with HF purification. One source (from China) contains minimal As and is the optimal raw material for Ultra high purity HF. Low-arsenic HF, manufactured from this material and then further purified, is available from Allied Chemical in the US. Other impurities, in conventional systems, are contributed by the HF generation and handling system. These impurities result from degradation of these systems; these systems were designed for applications much less demanding than the semiconductor industry. These contaminants must be removed in order to achieve good semiconductor performance.

HF Purification and Vaporization

The starting material is prefeerably low-arsenic HF. Such acid is commercially available from Allied Chemical (manufactured in Geismar La.). Such material, as used in the presently preferred embodiment, has an incoming arsenic concentration specified at <1 ppb.

Optionally, however, a batch process arsenic removal and evaporation stage may be included to reduce the arsenic concentration before the Ionic Purifier column. The Ionic Purifier column is followed by the HF Supplier (HFS). In this optional embodiment, arsenic will be converted to the +5 state and held in the evaporator during distillation by the addition of an oxidant ($KMnO_4$ or $(NH_4)_2S_2O_8$) and a cation source such as $KHF_2$ to form the salt $K_2AsF_7$. This will be a batch process as this reaction is slow and sufficient time for completion must be allowed before the distillation takes place. This process requires contact times of approximately 1 hr at nominal temperatures. In this process the HF would be introduced into a batch process evaporator vessel and would be treated with an oxidant while stirring for a suitable reaction time.

The low-arsenic HF is then distilled in a fractionating column with reflux thus removing the bulk of the metallic impurities. Elements showing significant reduction at this step include:

| | |
|---|---|
| Group 1 (I) | Na, |
| Group 2 (II) | Ca, Sr, Ba, |
| Groups 3–12 (IIIA–IIA) | Cr, W, Mo, Mn, Fe, Cu, Zn |
| Group 13 (III) | Ga, |
| Group 14 (IV) | Sn, Pb, and |
| Group 15 (VII) | Sb. |

This fractionating column acts as a series of many simple distillations; this is achieved by packing the column with a high surface area material with a counter current liquid flow thus ensuring complete equilibrium between the descending liquid and rising vapor. Only a partial condenser will be installed in this column to provide reflux and the purified gaseous HF will then be conducted to the HF Ionic Purifier (HF IP). The HF at this stage is pure by normal standards.

The HF IP will be utilized as an additional purity guarantee prior to introduction of the HF gas into the supplier systems. These elements may be present in the treatment solution or introduced in the IP to absorb sulfate carried over in the HF stream. IP testing has demonstrated significant reductions in the HF gas stream contamination for the following elements:

| | |
|---|---|
| Group 2 (II) | Sr, and Ba, |
| Groups 6–12 (VIA–IIA) | Cr, W, and Cu, |
| Group 13 (III) | B, |
| Group 14 (IV) | Pb, Sn, and |
| Group 15 (V) | Sb. |

Many of these elements are useful in addressing the As contamination suppression. Any carry over in the distillation column arising from their excess in the As treatment can be rectified at this step.

Note that the batch As removal step can be omitted if HF which is sufficiently low in arsenic can be obtained. As of 1995 such material is commercially available in the US from Allied Chemical.

On-Site Preparation of Ultrapure Buffered-HF and
$NH_4F$

As noted above, hydrofluoric acid (HF) is an extremely important process chemical in semiconductor manufacturing. It is often used in a buffered form, to reduce shifts in pH as the acid solution becomes loaded by etching by-products. (Reaction of HF with silicon produces fluosilicilic acid; this strong acid will shift the pH of the solution and hence the etch rate). Buffering of acids for such reasons is extremely well-known; but with ultra-high-purity chemicals the requirement for buffering presents further problems, since the buffering agent too is a source of contaminants, and must be sufficiently pure to not degrade the system.

In buffered hydrofluoric acid (buffered-HF), the buffering in the acid solution is usually provided by an ammonium component. According to the disclosed innovative embodiments, buffered hydrofluoric acid can be prepared by bubbling ammonia into an acid solution.

This process includes both buffered HF and ammonium fluoride, the only process difference being the $NH_3$ to HF mole ratio. $NH_4F$ solutions have a mole ratio of 1.00 while the buffered HF has a mole excess of HF. The same equipment is used for both solutions, except that the set point on the concentration instrumentation would be set to achieve the desired mole ratio.

BRIEF DESCRIPTION OF THE DRAWINGS

The disclosed inventions will be described with reference to the accompanying drawings, which show important sample embodiments of the invention and which are incorporated in the specification hereof by reference, wherein:

FIGS. 3B1–3B3 show detailed P&ID diagrams of a sample implementation of the process flow of FIG. 3A.

DETAILED DESCRIPTION OF THE PREFERRED EMBODIMENTS

Figure 1:
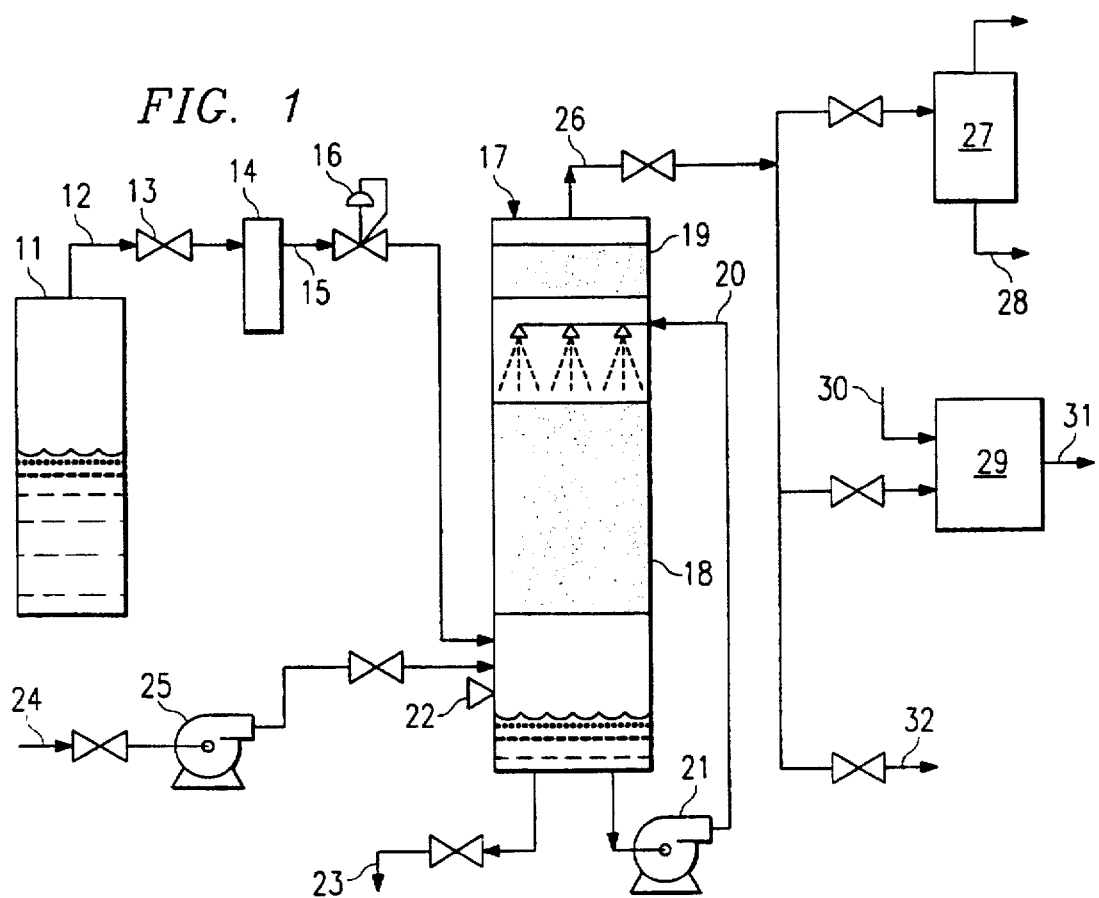
FIG. 1 is an engineering flow diagram of one example of a unit for the production of ultrapure ammonia.

The numerous innovative teachings of the present application will be described with particular reference to the presently preferred embodiment (by way of example, and not of limitation), in which:

Purification of $NH_3$

In accordance with this invention, ammonia vapor is first drawn from the vapor space in a liquid ammonia supply reservoir. Drawing vapor in this manner serves as a single-stage distillation, leaving certain solid and high-boiling impurities behind in the liquid phase. The supply reservoir can be any conventional supply tank or other reservoir suitable for containing ammonia, and the ammonia can be in anhydrous form or an aqueous solution. The reservoir can be maintained at atmospheric pressure or at a pressure above atmospheric if desired to enhance the flow of the ammonia through the system. The reservoir is preferably heat controlled, so that the temperature is within the range of from about 10° to about 50° C., preferably from about 15° to about 35° C., and most preferably from about 20° to about 25° C.

Impurities that will be removed as a result of drawing the ammonia from the vapor phase include metals of Groups I and II of the Periodic Table, as well as aminated forms of these metals which form as a result of the contact with ammonia. Also rejected will be oxides and carbonates of these metals, as well as hydrides such as beryllium hydride and magnesium hydride; Group III elements and their oxides, as well as ammonium adducts of hydrides and halides of these elements; transition metal hydrides; and heavy hydrocarbons and halocarbons such as pump oil.

The ammonia drawn from the reservoir is passed through a filtration unit to remove any solid matter entrained with the vapor. Microfiltration and ultrafiltration units and membranes are commercially available and can be used. The grade and type of filter will be selected according to need. The presently preferred embodiment uses a gross filter, followed by a 0.1 micron filter, in front of the ionic purifier, and no filtration after the ionic purifier.

The filtered vapor is then passed to a scrubber in which the vapor is scrubbed with high-pH purified (preferably deionized) water. The high-pH water is preferably an aqueous ammonia solution, with the concentration raised to saturation by recycling through the scrubber. The scrubber may be conveniently operated as a conventional scrubbing column in countercurrent fashion. Although the operating temperature is not critical, the column is preferably run at a temperature ranging from about 10° to about 50° C., preferably from about 15° to about 35° C. Likewise, the operating pressure is not critical, although preferred operation will be at a pressure of from about atmospheric pressure to about 30 psi above atmospheric. The column will typically contain a conventional column packing to provide for a high degree of contact between liquid and gas, and preferably a mist removal section as well.

In one presently preferred example, the column has a packed height of approximately 3 feet (0.9 meter) and an internal diameter of approximately 7 inches (18 cm), to achieve a packing volume of 0.84 cubic feet (24 liters), and is operated at a pressure drop of about 0.3 inches of water (0.075 kPa) and less than 10% flood, with a recirculation flow of about 2.5 gallons per minute (0.16 liter per second) nominal or 5 gallons per minute (0.32 liter per second) at 20% flood, with the gas inlet below the packing, and the liquid inlet above the packing but below the mist removal section. Preferred packing materials for a column of this description are those which have a nominal dimension of less than one-eighth of the column diameter. The mist removal section of the column will have a similar or more dense packing, and is otherwise conventional in construction. It should be understood that all descriptions and dimensions in this paragraph are examples only. Each of the system parameters may be varied.

In typical operation, startup is achieved by first saturating deionized water with ammonia to form a solution for use as the starting scrubbing medium. During operation of the scrubber, a small amount of liquid in the column sump is drained periodically to remove accumulated impurities.

Examples of impurities that will be removed by the scrubber include reactive volatiles such as silane ($SiH_4$) and arsine ($AsH_3$); halides and hydrides of phosphorus, arsenic, and antimony; transition metal halides in general; and Group III and Group VI metal halides and hydrides.

The units described up to this point may be operated in either batchwise, continuous, or semi-continuous manner. Continuous or semi-continuous operation is preferred. The volumetric processing rate of the ammonia purification system is not critical and may vary widely. In most operations for which the present invention is contemplated for use, however, the flow rate of ammonia through the system will be within the range of about 200 cc/h to thousands of liters per hour.

Optionally the ammonia leaving the scrubber can be further purified prior to use, depending on the particular type of manufacturing process for which the ammonia is being purified. When the ammonia is intended for use in chemical vapor deposition, for example, the inclusion of a dehydration unit and a distillation unit in the system will be beneficial. The distillation column may also be operated in either batchwise, continuous, or semi-continuous manner. In a batch operation, a typical operating pressure might be 300 pounds per square inch absolute (2,068 kPa), with a batch size of 100 pounds (45.4 kg). The column in this example has a diameter of 8 inches (20 cm), a height of 72 inches (183 cm), operating at 30% of flood, with a vapor velocity of 0.00221 feet per second (0.00067 meter per second), a height equivalent to a theoretical plate of 1.5 inches (3.8 cm), and 48 equivalent plates. The boiler size in this example is about 18 inches (45.7 cm) in diameter and 27 inches (68.6 cm) in length, with a reflux ratio of 0.5, and recirculating chilled water enters at 60° F. (15.6° C.) and leaves at 90° F. (32.2° C.). Again, this is merely an example; distillation columns varying widely in construction and operational parameters can be used.

Depending on its use, the purified ammonia, either with or without the distillation step, may be used as a purified gas or as an aqueous solution, in which case the purified ammonia is dissolved in purified (preferably deionized) water. The proportions and the means of mixing are conventional.

A flow chart depicting one example of an ammonia purification unit in accordance with this invention is shown in FIG. 1. Liquid ammonia is stored in a reservoir 11. Ammonia vapor 12 is drawn from the vapor space in the reservoir, then passed through a shutoff valve 13, then through a filter 14. The filtered ammonia vapor 15, whose flow is controlled by a pressure regulator 16, is then directed to a scrubbing column 17 which contains a packed section 18 and a mist removal pad 19. Saturated aqueous ammonia 20 flows downward as the ammonia vapor flows upward, the liquid being circulated by a circulation pump 21, and the liquid level controlled by a level sensor 22. Waste 23 is drawn off periodically from the retained liquid in the bottom of the scrubber. Deionized water 24 is supplied to the scrubber 17, with elevated pressure maintained by a pump 25. The scrubbed ammonia 26 is directed to one of three alternate routes. These are:

(1) A distillation column 27 where the ammonia is purified further. The resulting distilled ammonia 28 is then directed to the point of use.

(2) A dissolving unit 29 where the ammonia is combined with deionized water 30 to form an aqueous solution 31, which is directed to the point of use. For plant operations with multiple points of use, the aqueous solution can be collected in a holding tank from which the ammonia is drawn into individual lines for a multitude of point-of-use destinations at the same plant.

(3) A transfer line 32 which carries the ammonia in gaseous form to the point of use. The second and third of these alternatives, which do not utilize the distillation column 27, are suitable for producing ammonia with less than 100 parts per trillion of any metallic impurity. For certain uses, however, the inclusion of the distillation column 27 is preferred. Examples are furnace or chemical vapor deposition (CVD) uses of the ammonia. If the ammonia is used for CVD, for example, the distillation column would remove non-condensables such as oxygen and nitrogen, that might interfere with CVD. In addition, since the ammonia leaving the scrubber 17 is saturated with water, a dehydration unit may be incorporated into the system between the scrubber 17 and the distillation column 27, as an option, depending on the characteristics and efficiency of the distillation column.

With any of these alternatives, the resulting stream, be it gaseous ammonia or an aqueous solution, may be divided into two or more branch streams, each directed to a different use station, the purification unit thereby supplying purified ammonia to a number of use stations simultaneously.

Purification of HF

Figure 4:
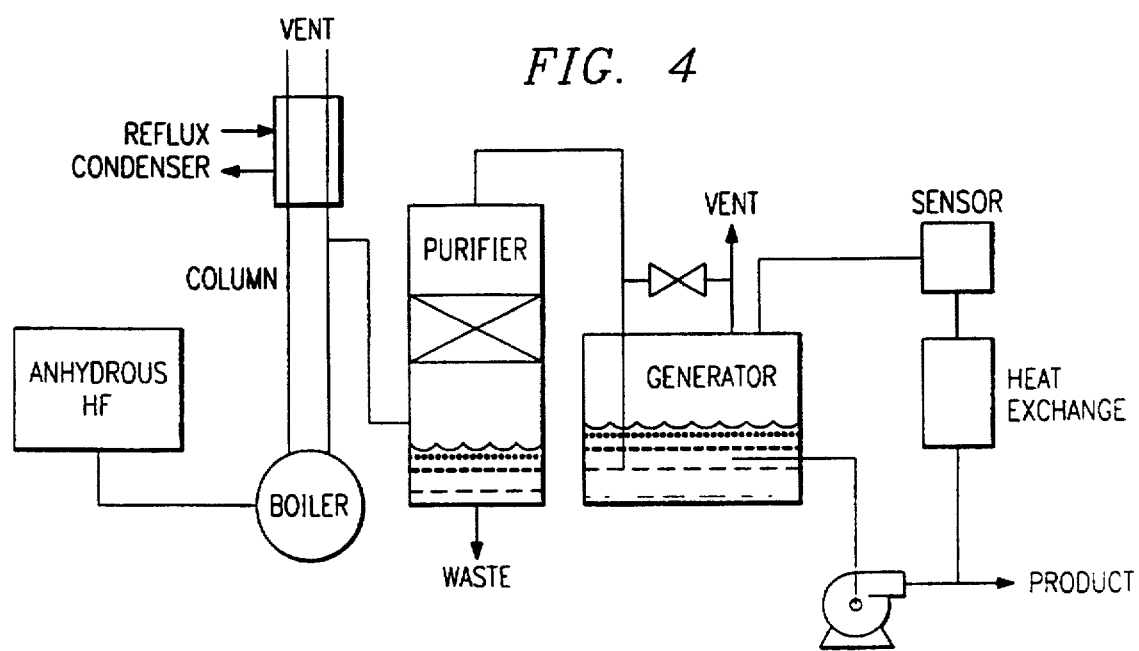
FIG. 4 shows an on-site HF purifier according to a sample embodiment of the disclosed innovations.

FIG. 4 shows an on-site HF purifier according to a sample embodiment of the disclosed innovations.

The starting material is preferably ultrapure 49% HF which is essentially arsenic-free (arsenic concentration below 1 ppb). As noted above, such low-arsenic material is commercially available from Allied, and can used, in combination with an on-site ionic purification process which does NOT include an arsenic oxidation reagent, to produce ultrapure HF on-site.

In an alternative and less preferred embodiment, an initial batch HF purification is accomplished by first oxidizing arsenic into the +5 oxidation state and fractionation to remove the $As^{+5}$ and metallic impurities. See U.S. Pat. No. 4,929,435, which is hereby incorporated by reference. A variety of oxidizing reagents have been used for this purpose, as shown in the literature. Fluorine ($F_2$) has been shown to work (by the published work of others), and is regarded as the presently preferred implementation of this alternative embodiment. $F_2$ requires expensive plumbing and safeguards, but has been shown to be workable. An alternative embodiment uses ammonium persulfate $((NH_4)_2S_2O_8)$, which is conveniently available in ultra-high purity. In general, oxidizers which do not introduce metal atoms are preferred; thus other candidates include $H_2O_2$ and $O_3$. A less preferred candidate is Caro's acid (persulfuric acid, $H_2SO_5$, which produces $H_2O_2$ in solution). Another option is $ClO_2$, but this has the severe disadvantage of being explosive. Other options include $HNO_3$ and $Cl_2$, but both of these introduce anions which must be separated out. (Reduction of non-metallic anions is not as critical as reduction of metal cations, but it is still desirable to achieve anion levels of 1 ppb or less. Initial introduction of anions thus adds to the load on the ionic purification stage). $KMnO_4$ is the most conventional oxidant, and is predicted to be useable for ultrapurification if followed by the disclosed ionic purifier and HF stripping process. However, this reagent imposes a substantial burden of cations on the purifier, so a metal-free oxidizer is preferred.

The HF process flow includes a batch process arsenic removal and evaporation stage, a fractionating column to remove most other impurities, an Ionic Purifier column to suppress contaminants not removed by the fractionating column, and finally the HF Supplier (HFS).

Arsenic will be convened to the +5 state and held in the evaporator during distillation by the addition of an oxidant ($KMnO_4$ or $(NH_4)_2S_2O_8$) and a cation source such as $KHF_2$ to form the salt $K_2AsF_7$. This will be a batch process as this reaction is slow and sufficient time for completion must be allowed before the distillation takes place. This process requires contact times of approximately 1 hr at nominal temperatures. To achieve complete reaction in a continuous process would require high temperatures and pressures (undesirable for safety) or very large vessels and piping. In this process the HF would be introduced into a batch process evaporator vessel and would be treated with an oxidant while stirring for a suitable reaction time.

The HF is then distilled in a fractionating column with reflux thus removing the bulk of the metallic impurities. Elements showing significant reduction at this step include:

| | |
|---|---|
| Group 1 (I) | Na, |
| Group 2 (II) | Ca, Sr, Ba, |
| Groups 3–12 (IIIA–IIA) | Cr, W, Mo, Mn, Fe, Cu, Zn |
| Group 13 (III) | Ga, |
| Group 14 (IV) | Sn, Pb, and |
| Group 15 (VII) | Sb. |

This fractionating column acts as a series of many simple distillations; this is achieved by packing the column with a high surface area material with a counter current liquid flow thus ensuring complete equilibrium between the descending liquid and rising vapor. Only a partial condenser will be installed in this column to provide reflux and the purified gaseous HF will then be conducted to the HF Ionic Purifier (HF IP). The HF at this stage is pure by normal standards, except for the possible carry over of the arsenic treatment chemicals or the quench required to remove these chemicals.

The HF IP will be utilized as an additional purity guarantee prior to introduction of the HF gas into the supplier systems. These elements may be present in the treatment solution or introduced in the IP to absorb sulfate carried over in the HF stream. IP testing has demonstrated significant reductions in the HF gas stream contamination for the following elements:

| | |
|---|---|
| Group 2 (II) | Sr, and Ba, |
| Groups 6–12 (VIA–IIA) | Cr, W, and Cu, |
| Group 13 (III) | B, |
| Group 14 (IV) | Pb, Sn, and |
| Group 15 (V) | Sb. |

Many of these elements are useful in addressing the As contamination suppression. Any carry over in the distillation column arising from their excess in the As treatment can be rectified at this step.

Various modifications of the concentration control loop (using conductivity, etc., in place of acoustic velocity) can be implemented if desired.

In an alternative embodiment of the disclosed innovation, the on-site purifier can use high-purity arsenic-reduced hydrofluoric acid as the bulk starting material. In this embodiment no oxidation step is needed.

Generation of Buffered HF

Figure 3A:
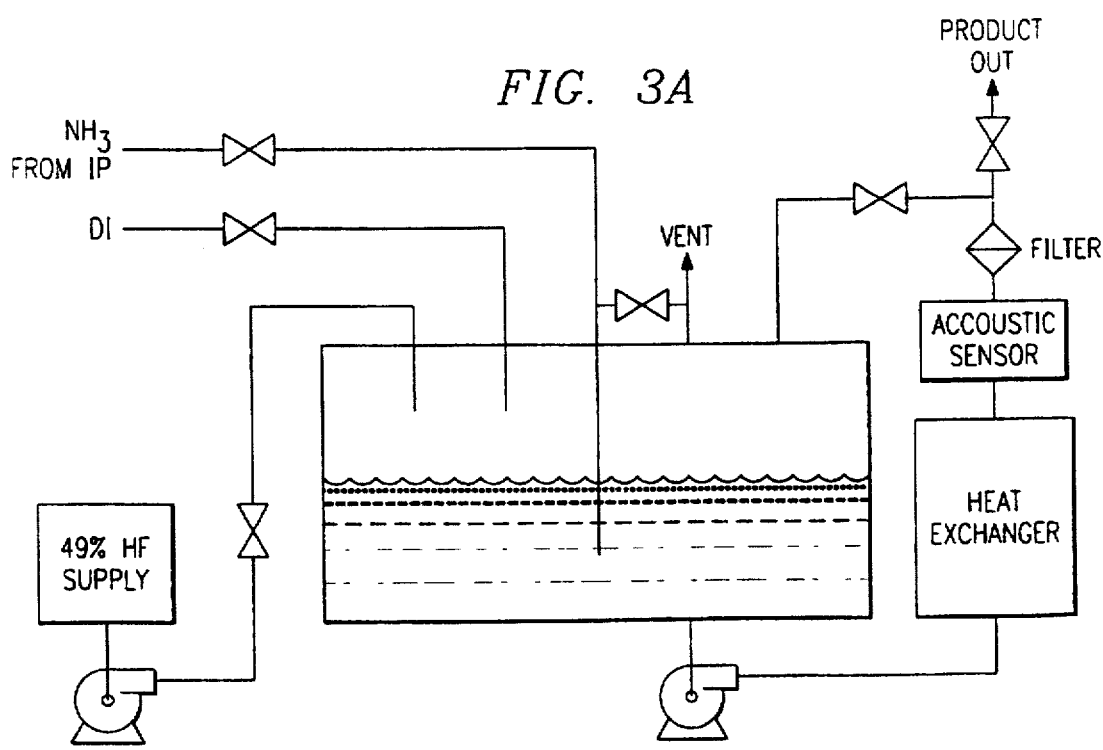
FIG. 3A shows an overview of the process flow in a generation unit in which ultrapure ammonia is introduced into hydrofluoric acid to produce buffered-HF.

FIG. 3A shows an overview of the process flow in a generation unit in which ultrapure ammonia is introduced into hydrofluoric acid to produce buffered-HF, and FIGS. 3B1–3B3 show detailed P&ID diagrams of a sample implementation of the process flow of FIG. 3A.

In the presently preferred embodiment, the liquid volume of the ammonia purifier is 10 l, and the maximum gas flow rate is about 10 standard l/min. The scrubbing liquid is purged—continuous or incrementally—sufficiently to turn over at least once in 24 hrs.

Product concentration (at both generation steps) is measured using acoustic velocity measurement equipment (from Mesa Labs) to measure concentration—but alternatively measurements could be performed using conductivity, density, index of refraction, or IR spectroscopy.

To set up the process one must determine the concentration of total HF and $NH_3$ to be dissolved in water. For example, 1 kg. of 40% by weight ammonium, fluoride solution would contain 400 g of $NH_4F$ and 600 g of ultra pure water. Since the mole ratio of HF to $NH_3$ is 1:1 for pure $NH_4F$ the 400 g of $NH_4F$ would include 216 g of anhydrous HF and 184 g of anhydrous $NH_3$. (MW $NH_4F$ 237, MW HF=20, MW $NH_3$–17).

At the completion of the HF formation cycle 216 g of HF is dissolved in 600 g of water or 26.5% by weight. The on-board instrumentation is sent to add HF to their concentration. Alternatively, 49% HF can be diluted to this concentration.

After the 26.5% HF solution is formed 189 g of $N_H3$ is added to form the 40% $NH_4F$ solution.

Other concentration and mole ratios may be set by the concentration instrumentation for different application by adjustment of the concentration instrumentation.

Wafer Cleaning

Figure 2:
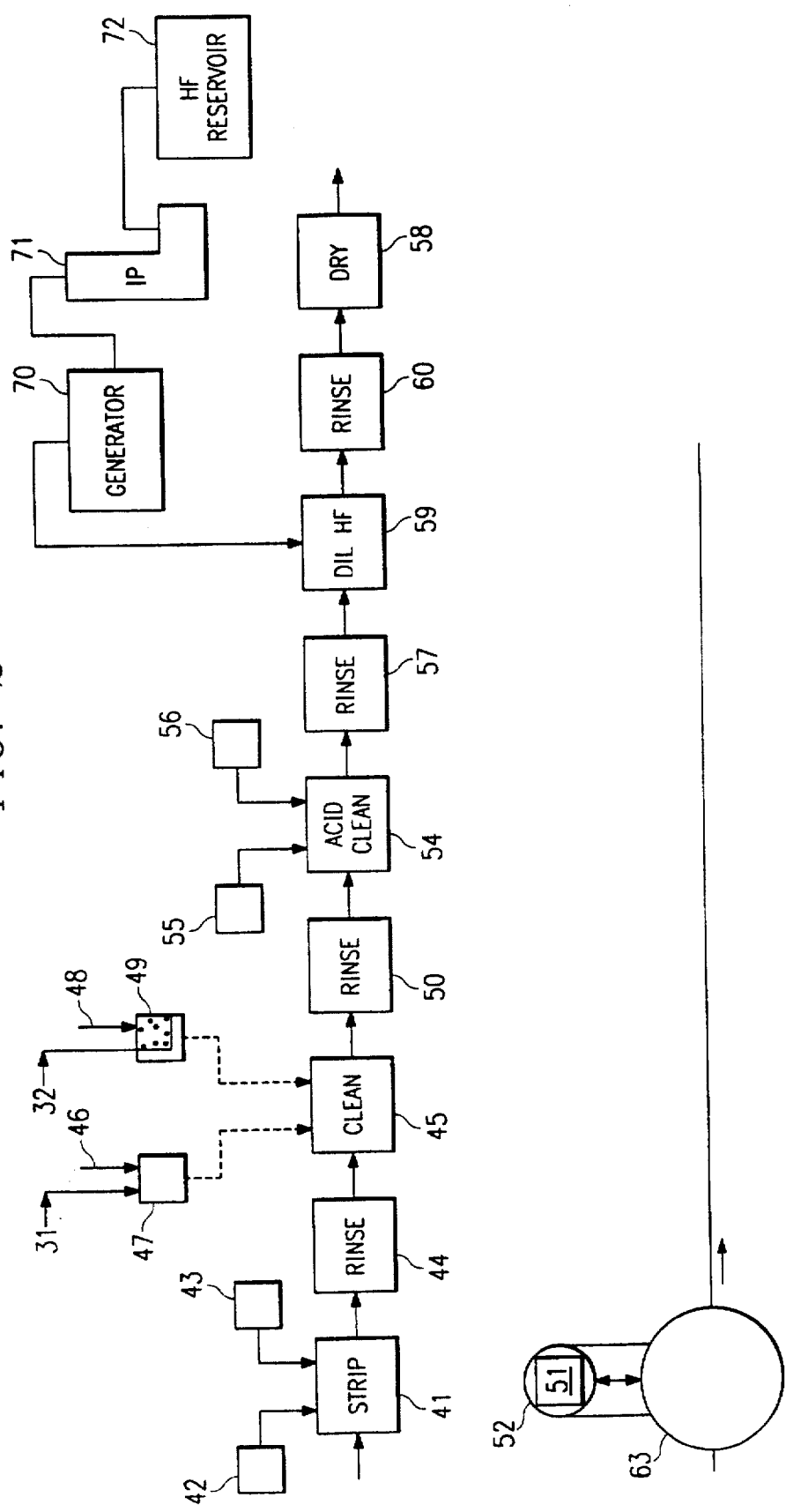
FIG. 2 is a block diagram of a semiconductor fabrication line to which the generator of FIG. 4 may be connected.

Some cleanup stations in a conventional line for semiconductor fabrication are depicted in FIG. 2. The first unit in the cleaning line is a resist stripping station 41 where aqueous hydrogen peroxide 42 and sulfuric acid 43 are combined and applied to the semiconductor surface to strip off the resist. This is succeeded by a rinse station 44 where deionized water is applied to rinse off the stripping solution. Immediately downstream of the rinse station 44 is a cleaning station 45 where an aqueous solution of ammonia and hydrogen peroxide are applied. This solution is supplied in one of two ways. In the first, aqueous ammonia 31 is combined with aqueous hydrogen peroxide 46, and the resulting mixture 47 is directed to the cleaning station 45. In the second, pure gaseous ammonia 32 is bubbled into an aqueous hydrogen peroxide solution 48 to produce a similar mixture 49, which is likewise directed to the cleaning station 45. Once cleaned with the ammonia/hydrogen peroxide combination, the semiconductor passes to a second rinse station 50 where deionized water is applied to remove the cleaning solution. The next station is a further cleaning station 54 where aqueous solutions of hydrochloric acid 55 and hydrogen peroxide 56 are combined and applied to the semiconductor surface for further cleaning. This is followed by a final rinse station 57 where deionized water is applied to remove the HCl and $H_2O_2$. At deglaze station 59 dilute buffered HF is applied to the wafer (for removal of native or other oxide film). The dilute buffered hydrofluoric acid is supplied directly, through sealed piping, from the generator 70. As described above, the reservoir 72 holds anhydrous HF, from which a stream of gaseous HF is fed through the ionic purifier 71 into generator 70. Preferably gaseous ammonia is also bubbled into generator 70 to provide a buffered solution, and ultrapure deionized water is added to achieve the desired dilution. This is followed by a rinse in ultrapure deionized water (at station 60), and drying at station 58. The wafer or wafer batch 61 will be held on a wafer support 52, and conveyed from one workstation to the next by a robot 63 or some other conventional means of achieving sequential treatment. The means of conveyance may be totally automated, partially automated or not automated at all.

The system shown in FIG. 2 is just one example of a cleaning line for semiconductor fabrication. In general, cleaning lines for high-precision manufacture can vary widely from that shown in FIG. 2, either eliminating one or more of the units shown or adding or substituting units not shown. The concept of the on-site preparation of high-purity aqueous ammonia, however, in accordance with this invention is applicable to all such systems.

The use of ammonia and hydrogen peroxide as a semiconductor cleaning medium at workstations such as the cleaning station 45 shown in FIG. 2 is well known throughout the industry. While the proportions vary, a nominal system would consist of deionized water, 29% ammonium hydroxide (weight basis) and 30% hydrogen peroxide (weight basis), combined in a volume ratio of 6:1:1. This cleaning agent is used to remove organic residues, and, in conjunction with ultrasonic agitation at frequencies of approximately 1 MHz, removes particles down to the sub-micron size range.

In one class of embodiments, the purification (or purification and generation) system is positioned in close proximity to the point of use of the ultrapure chemical in the production line, leaving only a short distance of travel between the purification unit and the production line. Alternatively, for plants with multiple points of use, the ultrapure chemical from the purification (or purification and generation) unit may pass through an intermediate holding tank before reaching the points of use. Each point of use will then be fed by an individual outlet line from the holding tank. In either case, the ultrapure chemical can therefore be directly applied to the semiconductor substrate without packaging or transport and without storage other than a small in-line reservoir, and thus without contact with the potential sources of contamination normally encountered when chemicals are manufactured and prepared for use at locations external to the manufacturing facility. In this class of embodiments, the distance between the point at which the ultrapure chemical leaves the purification system and its point of use on the production line will generally be a few meters or less. This distance will be greater when the purification system is a central plant-wide system for piping to two or more use stations, in which case the distance may be two thousand feet or greater. Transfer can be achieved through an ultra-clean transfer line of a material which does not introduce contamination. In most applications, stainless steel or polymers such as high density polyethylene or fluorinated polymers can be used successfully.

Due to the proximity of the purification unit to the production line, the water used in the unit can be purified in accordance with semiconductor manufacturing standards. These standards are commonly used in the semiconductor industry and well known among those skilled in the art and experienced in the industry practices and standards. Methods of purifying water in accordance with these standards include ion exchange and reverse osmosis. Ion exchange methods typically include most or all of the following units: chemical treatment such as chlorination to kill organisms; sand filtration for particle removal; activated charcoal filtration to remove chlorine and traces of organic matter; diatomaceous earth filtration; anion exchange to remove strongly ionized acids; mixed bed polishing, containing both cation and anion exchange resins to remove further ions; sterilization, involving chlorination or ultraviolet light; and filtration through a filter of 0.45 micron or less. Reverse osmosis methods will involve, in place of one or more of the units in the ion exchange process, the passage of the water under pressure through a selectively permeable membrane which does not pass many of the dissolved or suspended substances. Typical standards for the purity of the water resulting from these processes are a resistivity of at least about 15 megohm-cm at 25° C. (typically 18 megohm-cm at 25° C.), less than about 25 ppb of electrolytes, a particulate content of less than about 150/cm$^3$ and a particle size of less than 0.2 micron, a microorganism content of less than about 10/cm$^3$, and total organic carbon of less than 100 ppb.

In the process and system of this invention, a high degree of control over the product concentration and hence the flow rates is achieved by precise monitoring and metering using known equipment and instrumentation. A convenient means of achieving this is by acoustic velocity sensing. Other methods will be readily apparent to those skilled in the art. Various modifications of the concentration control loop (using conductivity, etc., in place of acoustic velocity) can be implemented if desired.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

For example, the disclosed innovative techniques are not strictly limited to manufacture of integrated circuits, but can also be applied to manufacturing discrete semiconductor components, such as optoelectronic and power devices.

For another example, the disclosed innovative techniques can also be adapted to manufacture of other technologies where integrated circuit manufacturing methods have been adopted, such as in thin-film magnetic heads and active-matrix liquid-crystal displays; but the primary application is in integrated circuit manufacturing, and applications of the disclosed techniques to other areas are secondary.

For another example, it is not strictly necessary to use a scrubber to perform the liquid-vapor contact; a bubbler could be used instead, although this is much less desirable because of the less efficient gas/liquid contact.

Optionally other filtration or filtration stages can be combined with the disclosed purification apparatus.

It should also be noted that additives can be introduced into the purification water if desired, although this is not done in the presently preferred embodiment.

As noted above, the primary embodiment is an on-site purification system. Alternatively, in a less preferred class of embodiment, the disclosed purification system can also be adapted to operate as a part of a manufacturing unit to produce ultra-high-purity chemicals for shipment; however, this alternative embodiment does not provide the advantages of on-site purification as discussed above. Such applications encounter the inherent risks of handling ultra-high-purity chemicals, as discussed above; but for customers who require packaged chemicals (with the attendant handling), the disclosed innovations at least give a way to achieve an initial purity which is higher than that available by other techniques. Again, in such applications a dryer stage may also be used after the ionic purifier.

As noted above, the primary embodiment is directed to providing ultrapure aqueous chemicals, which are most critical for semiconductor manufacturing. However, the disclosed system and method embodiments can also be used for supply of purified gas streams. (In many cases, use of a dryer downstream from the purifier will be useful for this).

It should also be noted that piping for ultrapure chemical routing in semiconductor front ends may include in-line or pressure reservoirs. Thus references to "direct" piping in the claims do not preclude use of such reservoirs, but do preclude exposure to uncontrolled atmospheres.

What is claimed is:

1. An on-site subsystem, in a semiconductor device fabrication facility, for providing ultra-high-purity buffered ammonium fluoride or hydrofluoric acid to a semiconductor manufacturing operation, comprising:

a first evaporation source connected to receive an HF source and to provide a flow of HF vapor therefrom;

a second evaporation source connected to receive a liquid source of ammonia and to provide a flow of ammonia vapor therefrom;

said flow of HF vapor being connected to pass through a first ionic purifier unit which provides a recirculating volume of high-purity water, containing a high concentration of HF, in contact with said flow of HF vapor, wherein said first purifier passes purified HF gas; and said flow of ammonia vapor being connected to pass through a second ionic purifier unit which provides a recirculating volume of high-purity water, containing a high concentration of ammonium hydroxide, in contact with said flow of ammonia vapor, wherein said second purifier passes purified ammonia gas;

a first generator unit, connected to receive said flow of HF gas from said first purifier and to combine said HF gas with high-purity acidic deionized water to produce ultra-pure hydrofluoric acid, said first generator unit also passing a top stream of impure HF gas contaminated with light impurities;

said ultra-pure hydrofluoric acid and said flow of ammonia vapor being connected to pass into a second generator, which combines said ammonia vapor into said ultra-pure hydrofluoric acid to produce an aqueous solution of ultra-pure buffered hydrofluoric acid of controlled concentration; and a piping connection which routes said aqueous solution to points of use in the semiconductor device fabrication facility.

2. The system of claim 1, wherein said HF source consists of anhydrous HF.

3. The system of claim 1, wherein neither said recirculating volume of high-purity water contains any additives whatsoever.

4. The system of claim 1, wherein said HF source is essentially arsenic-free.

5. The system of claim 1, wherein said HF source uses ultrapure arsenic-free aqueous HF.

* * * * *